United States Patent [19]
DeMeester et al.

[11] Patent Number: 6,023,167
[45] Date of Patent: Feb. 8, 2000

[54] SURFACE COILS WITH INTEGRATED SHIMS

[75] Inventors: Gordon D. DeMeester, Wickliffe; Michael A. Morich, Mentor, both of Ohio

[73] Assignee: Picker International, Inc., Highland Heights, Ohio

[21] Appl. No.: 09/013,617

[22] Filed: Jan. 26, 1998

[51] Int. Cl.$^7$ .................................................. G01V 3/00
[52] U.S. Cl. ........................... 324/318; 324/320; 324/309
[58] Field of Search .................................. 324/320, 309, 324/318

[56] References Cited

U.S. PATENT DOCUMENTS

| | | | |
|---|---|---|---|
| 4,680,551 | 7/1987 | O'Donnell et al. | 324/320 |
| 4,740,753 | 4/1988 | Glover et al. | 324/320 |
| 5,351,006 | 9/1994 | Sumanaveera et al. | 324/309 |
| 5,391,990 | 2/1995 | Schmitt et al. | 324/320 |
| 5,532,597 | 7/1996 | McGinley et al. | 324/318 |
| 5,550,472 | 8/1996 | Richard et al. | 324/318 |
| 5,635,839 | 6/1997 | Srivastava et al. | 324/318 |

Primary Examiner—Christine K. Oda
Assistant Examiner—Brij B. Shrivastav
Attorney, Agent, or Firm—Fay, Sharpe, Fagan, Minnich & McKee, LLP

[57] ABSTRACT

A localized shim coil (34) for use in a magnetic resonance imaging system includes a plurality of conductive elements (22a–d). The plurality of conductive elements (62a–d) are connected to a current source (64). The plurality of conductive elements (62a–d) are arranged adjacent to a localized region of a subject being imaged such that current flowing through the conductive elements generates a localized magnetic field. A plurality of series connected choke and resister pairs (66a–d) and (68a–d), respectively, are connected to the plurality of conductive elements (62a–d). The chokes (66a–d) present high impedance to currents having frequencies substantially the same as a resonant frequency of the magnetic resonance imaging system. The resisters (68a–d) balance the current flowing through each conductive element (62a–d). The localized magnetic field is generated such that it is substantially equal and opposite to localized non-uniformities generated in the magnetic resonance system's main magnetic field by the subject's geometric shape and magnetic susceptibility in the localized region being imaged.

7 Claims, 4 Drawing Sheets

SURFACE COILS WITH INTEGRATED SHIMS

BACKGROUND OF THE INVENTION

The present invention relates to the magnetic resonance arts. It finds particular application in conjunction with medical diagnostic magnetic resonance imaging and will be described with particular reference thereto. However, it is to be appreciated that the present invention also finds application in magnetic resonance spectroscopy and magnetic resonance imaging for other applications.

Generally, nuclear magnetic resonance (NMR) and magnetic resonance imaging (MRI) techniques employ a spatially uniform and temporally constant main magnetic field, $B_0$, generated through an examination region. Superimposed on the $B_0$ magnetic field is a $B_1$ radio frequency (RF) magnetic field at the NMR resonant frequency. For MRI applications, there is also a set of gradient magnetic fields used to spatially encode resonant spins. Some MRI techniques such as fat suppression are extremely sensitive to magnetic field homogeneity at the one part per million level. The geometric shape and/or magnetic susceptibility of a subject being scanned can induce local non-uniformities in the magnetic fields as high as 1 to 3 ppm. Non-uniformities of this strength are large enough to produce local imaging and fat suppression problems.

Fat suppression is generally a known imaging technique wherein the relative brightness of fat and water in an image is changed to better reveal diagnostic information. The resonant frequency of fat is about 3.5 ppm below that of water. Consequently, one can selectively suppress either water, or more commonly, fat on the basis of the resonant frequency difference. Typically, this is accomplished by selectively exciting fat with a narrow band RF pulse including frequencies near the characteristic resonance frequency of fat. In principle, this leaves the water alone. Ideally, the radio frequency pulse is applied with a maximally uniform $B_0$ magnetic field. The magnetization that is not properly aligned is then spoiled with the application of a magnetic gradient following the RF pulse. The magnetization of fat is not given time to recover before the imaging sequence is run; thus, the fat signal contribution to the image is suppressed. However, if the magnetic field $B_0$ is not spatially constant, fat may not be uniformly suppressed or regions of water may be suppressed. Due to the shape of the RF pulses employed and the strength of the fat signal, magnetic field changes of less than 1 ppm can be seen as non-uniform fat suppression.

Because of geometric shape and magnetic susceptibility factors, there are some subjects and/or parts of the anatomy where fat suppression is particularly problematic. For example, the anatomy of the face and ankle are two regions where these factors affect local magnetic field homogeneity. Another one of the more problematic regions for scanning with the fat suppression technique is the cervical spine. Due to geometric shape and susceptibility factors, the fat in the shoulder to neck transition region can have a magnetic field 2 to 3 ppm higher than the magnetic field was at that same position without the subject present.

Previous methods for controlling the homogeneity of the magnetic field include both passive and active shimming techniques. The passive technique is typified by arranging shim steel to minimize static magnetic field inhomogeneities base upon NMR field plot measurements. Generally these steel shims are placed at a relatively large distance from the region of interest. For example, in cylindrical-type MRI apparatus, the steel shims are commonly placed at diameters comparable to the gradient coils and/or whole-body RF coils. The NMR field plot measurements are performed without a subject in the examination region. Generally, the shim steel technique is not adjustable on a scan-by-scan basis. It is mainly used to shim out the effects of magnet-built tolerances and environmental (site) effects. Therefore, this technique is not suited to handle local non-uniformities within the magnetic field caused by subject geometry and/or susceptibility.

Active shimming generally employed multiple orthogonal shim coils and/or gradient coil offsets. Shim and/or gradient offsets were adjusted at the beginning of each scan, especially before fat suppression, to optimize the $B_0$ uniformity with the subject present to account for susceptibility effects. The procedure generally looked to maximize the water signal while minimizing its spectral line width. In some cases, initial optimal shim currents were applied to the shim coils to initially establish uniform magnetic fields using the same type of NMR field plot measurements described above with reference to the passive technique. Commonly first order and occasionally second or third order corrections were implemented to compensate for non-uniformities in the magnetic field. While better uniformity was achieved using the active shimming techniques, the performance remained inadequate for certain applications. That is to say, some susceptibility based magnetic field uniformity problems occur over short ranges and/or small local regions of interest and were heretofore too difficult to shim out with lower order corrections.

Water and/or fat suppressed images may be achieved in a number of manners. One technique employs a spatial/spectral RF pulse for a 90° imaging pulse. This approach does not modify the pulse sequence to include a fat saturation pulse at the start. Rather, a water selective 90° pulse is built into the sequence from the start. However, this technique suffers the same magnetic field homogeneity problems as the fat suppression technique.

Another alternative to fat suppression is an inversion recovery sequence. Fat has a shorter T2 vector decay than water. In an inversion recovery sequence, a 180° RF pulse is applied, and both the water and fat magnetization is inverted. After 140 ms on a 1.5 T machine, the fat signal has dissipated, but there is remaining water to excite in the transverse plane for an MRI signal. This water signal can be used to produce images; however, they may not necessarily be the fast images a physician may desire.

As well, there are water and fat separation images. These require multiple acquisitions, more time, and more processing. Usually, these are based on the different resonant frequencies of fat and water causing the imaging signal from each voxel to move in and out of phase as time passes. Two images are calculated for each image element from the data, and the more quickly decaying signal is assigned to the fat image. One disadvantage is the inflexibility of the sequence and effective time interval, TE, from the RF pulse to the measurement of the MRI signal.

The present invention contemplates a new and improved localized shim coil for use in magnetic resonance applications which overcomes the above-referenced problems and others.

SUMMARY OF THE INVENTION

In accordance with one aspect of the present invention, a localized magnetic field shim coil for correcting localized non-uniformities in a local region of a main magnetic field in a magnetic resonance imaging system includes a plurality of conductive elements connected to a current source. The plurality of conductive elements are arranged adjacent to a localized region of a subject being imaged such that current flowing through the conductive elements generates a localized magnetic field. A plurality of series connected choke and resistor pairs are connected to each conductive element. The chokes suppress currents having frequencies substantially the same as the resonance frequency of the magnetic resonance imaging system. The resistors balance the current flowing through each conductive element. The localized magnetic field is substantially equal and opposite to localized non-uniformities generated in the magnetic resonance imaging systems main magnetic field by the subject's geometric shape and magnetic susceptibility in the localized region being imaged.

In accordance with a more limited aspect of the present invention, the localized shim coil is integrated into a radio frequency surface coil.

In accordance with a more limited aspect of the present invention, the conductive elements are connected in parallel.

In accordance with a more limited aspect of the present invention, the conductive elements are connected in series.

In accordance with a more limited aspect of the present invention, the localized shim coil is only engaged while a fat saturation pulse sequence is transmitted by the magnetic resonance system.

In accordance with a more limited aspect of the present invention, the localized shim coil is engaged during an entire imaging scan run by the magnetic resonance imaging system.

In accordance with another aspect of the present invention, a method of localized shimming of a main magnetic field in magnetic resonance imaging is provided. The method includes generating a localized magnetic field that is substantially equal and opposite to localized non-uniformities in a main magnetic field of a magnetic resonance imaging apparatus. The non-uniformities result from the geometric shape and susceptibility of a localized region of a subject being imaged within the main magnetic field.

In accordance with a more limited aspect of the present invention, generating a localized magnetic field is accomplished by arranging a plurality of conductive elements adjacent the localized region of the subject being imaged. An electrical current is then generated and applied to the plurality of conductive elements.

In accordance with a more limited aspect of the present invention, the plurality of conductive elements are arranged and connected to one another in one of a parallel fashion and a series fashion.

In accordance with a more limited aspect of the present invention, the method further includes restricting the flow of electrical currents having frequencies substantially the same as a resonant frequency of the magnetic resonance imaging apparatus through the plurality of conductive elements.

In accordance with a more limited aspect of the present invention, restricting the flow of electrical currents having frequencies substantially the same as a resonance frequency of the magnetic resonance imaging apparatus through the plurality of conductive elements is accomplished by connecting a plurality of chokes to each conductive element such that the chokes present high impedance to frequencies substantially the same as the resonance frequency.

In accordance with a more limited aspect of the present invention, the electrical current is only applied to the plurality of conductive elements for the duration of one of an application of a fat saturation sequence run by the magnetic resonance imaging apparatus and an entire imaging scan run by the magnetic resonance imaging apparatus.

In accordance with another aspect of the present invention, a method of magnetic resonance imaging includes generating a temporally constant magnetic field through a region of interest of a subject. In the region of interest, the temporally constant magnetic field has an inhomogeneity. Resonance is excited in the region of interest. Induced resonance signals are received and a magnetic resonance image is reconstructed from the received resonance signal. The method also includes temporarily generating a correction magnetic field in the region of interest contemporaneously with the magnetic resonance excitation, to correct the inhomogeneity.

In accordance with a more limited aspect of the present invention, the method further includes applying a preconditioning pulse prior to inducing resonance. The temporary correction magnetic field is generated during the preconditioning pulse.

In accordance with a more limited aspect of the present invention, the preconditioning pulse includes a tissue selective excitation pulse.

In accordance with a more limited aspect of the present invention, the excitation of magnetic resonance includes applying a sequence of pulses to induce resonance and refocus the resonance into an echo. The temporary correction magnetic field being generated during the sequence.

In accordance with a more limited aspect of the present invention, the magnetic resonance signals are received and the temporary correction magnetic field are generated with surface coils disposed contiguous to the region of interest.

In accordance with another aspect of the present invention, an integrated radio frequency and shim coil is provided. The integrated radio frequency and shim coil includes a radio frequency surface coil for receiving magnetic resonance signals emanating from a region of interest of a subject being examined. The radio frequency surface coil is positioned contiguous to the region of interest of the subject being examined. Also included is a shim coil integral with the radio frequency surface coil. The shim coil includes a plurality of conductive elements arranged such that electrical current flowing therein generates a localized magnetic field that substantially cancels localized inhomogeneities in a main magnetic field in the region of interest of the subject being examined. The localized inhomogeneities are induced by the subject's susceptibility and geometry in the region of interest.

One advantage of the present invention resides in its ability to accurately compensate for localized non-uniformities generated in the magnetic fields as a result of subject geometry and/or susceptibility.

Another advantage of the present invention resides in its ability to achieve high-quality fat suppression images showing features and having diagnostic information not otherwise obtainable.

Another advantage of the present invention resides in its ability to achieve very local shimming at the ppm level.

Another advantage of the present invention resides in its ability to be integrated into surface radio frequency coils.

Still further advantages of the present invention will become apparent to those of ordinary skill in the art upon reading and understanding the following detailed description of the preferred embodiments.

BRIEF DESCRIPTION OF THE DRAWINGS

The invention may take form in various parts and arrangements of parts. The drawings are only for purposes of illustrating a preferred embodiment and are not to be construed as limiting the invention.

DETAILED DESCRIPTION OF THE PREFERRED EMBODIMENT

Figure 1:
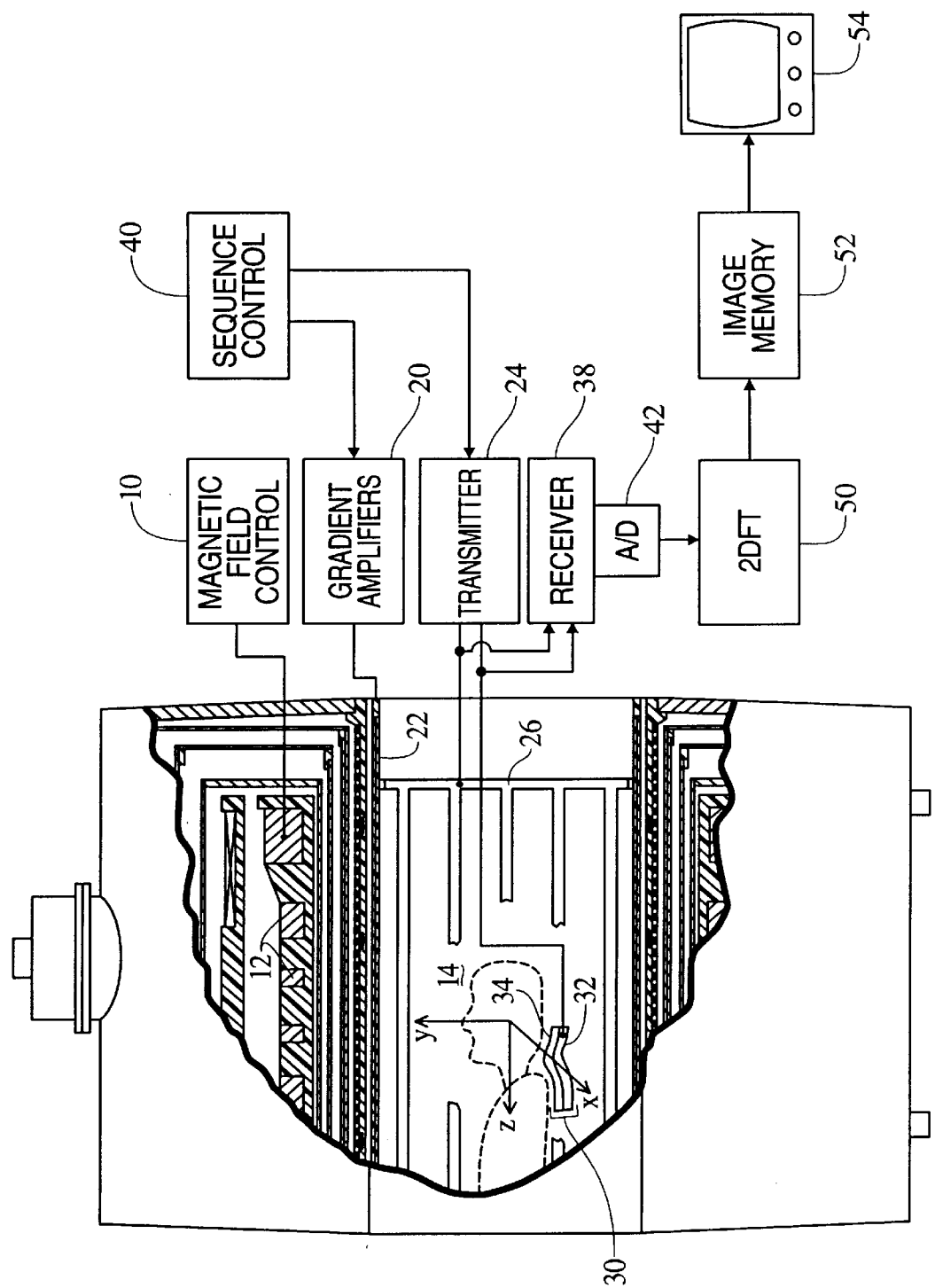
FIG. 1 is a diagrammatic illustration of at magnetic resonance imaging apparatus including surface coils with integrated shims in accordance with aspects of the present invention.

With reference to FIG. 1, a main magnet field control 10 controls superconducting or resistive magnets 12 such that a substantially uniform, temporally constant main magnetic field $B_0$ is created along a z axis through an examination region 14. A magnetic resonance echo means applies a series of radio frequency (RF) and magnetic field gradient pulses to invert or excite magnetic spins, induce magnetic resonance, refocus magnetic resonance, manipulate magnetic resonance, spatially and otherwise encode the magnetic resonance, to saturate spins, and the like to generate magnetic resonance imaging and spectroscopy sequences. More specifically, gradient pulse amplifiers 20 apply current pulses to selected ones or pairs of whole-body gradient coils 22 to create magnetic field gradients along x, y and z axis of the examination region 14. A digital radio frequency transmitter 24 transmits radio frequency pulses or pulse packets to a whole-body RF coil 26 to transmit RF pulses into the examination region 14. A typical radio frequency pulse is composed of a packet of immediately continuous pulse segments of short duration which taken together with each other and applied gradients achieve a selected magnetic resonance manipulation. The RF pulses are used to saturate, excite resonance, invert magnetization, refocus resonance, or manipulate resonance in selected portions of the examination region. For whole-body applications, the resonance signals are commonly picked up by the whole-body RF coil 26.

For generating images of local regions of the subject, specialized radio frequency coils are placed contiguous to the selected region. For example, a surface coil 30 is inserted adjacent a localized selected region such as the shoulder-to-neck transition region. The insertable surface coil 30 includes a radio frequency coil 32 and an integrated localized shim coil 34. The radio frequency coil portion 32 of the surface coil 30 is used to excite magnetic resonance and receive magnetic resonance signals emanating from the patient in the region being imaged. Alternatively, the radio frequency coil portion 32 of the surface coil 30 can be used only to receive resonance signals introduced by whole-body coil RF transmissions. In either case, the resultant radio frequency signals are picked up by the whole-body RF coil 26 or surface RF coil 32 and demodulated by a receiver 38, preferably a digital receiver.

A sequence control circuit 40 controls the gradient pulse amplifiers 20 and the transmitter 24 to generate any of a plurality of multiple echo sequences such as echo planar imaging, echo volume imaging, gradient and spin echo imaging, fast spin echo imaging, and the like. For selected sequences, the receiver 38 receives a plurality of data lines in rapid succession following each RF excitation pulse. An analog-to-digital converter 42 converts each data line to a digital format. The analog-to-digital converter is disposed between the radio frequency receiving coil and the receiver for digital receivers and is disposed downstream (as illustrated) from the receiver for analog receivers. Ultimately, the radio frequency signals received are demodulated and reconstructed into an image representation by a reconstruction processor 50 which applies a two-dimensional Fourier transform or other appropriate reconstruction algorithm. The image may represent a planar slice through the patient, an array of parallel planar slices, a three-dimensional volume, or the like. The image is then stored in an image memory 52 where it may be accessed by a display, such as a video monitor 54 which provides a human readable display of the resultant image.

Figure 2:
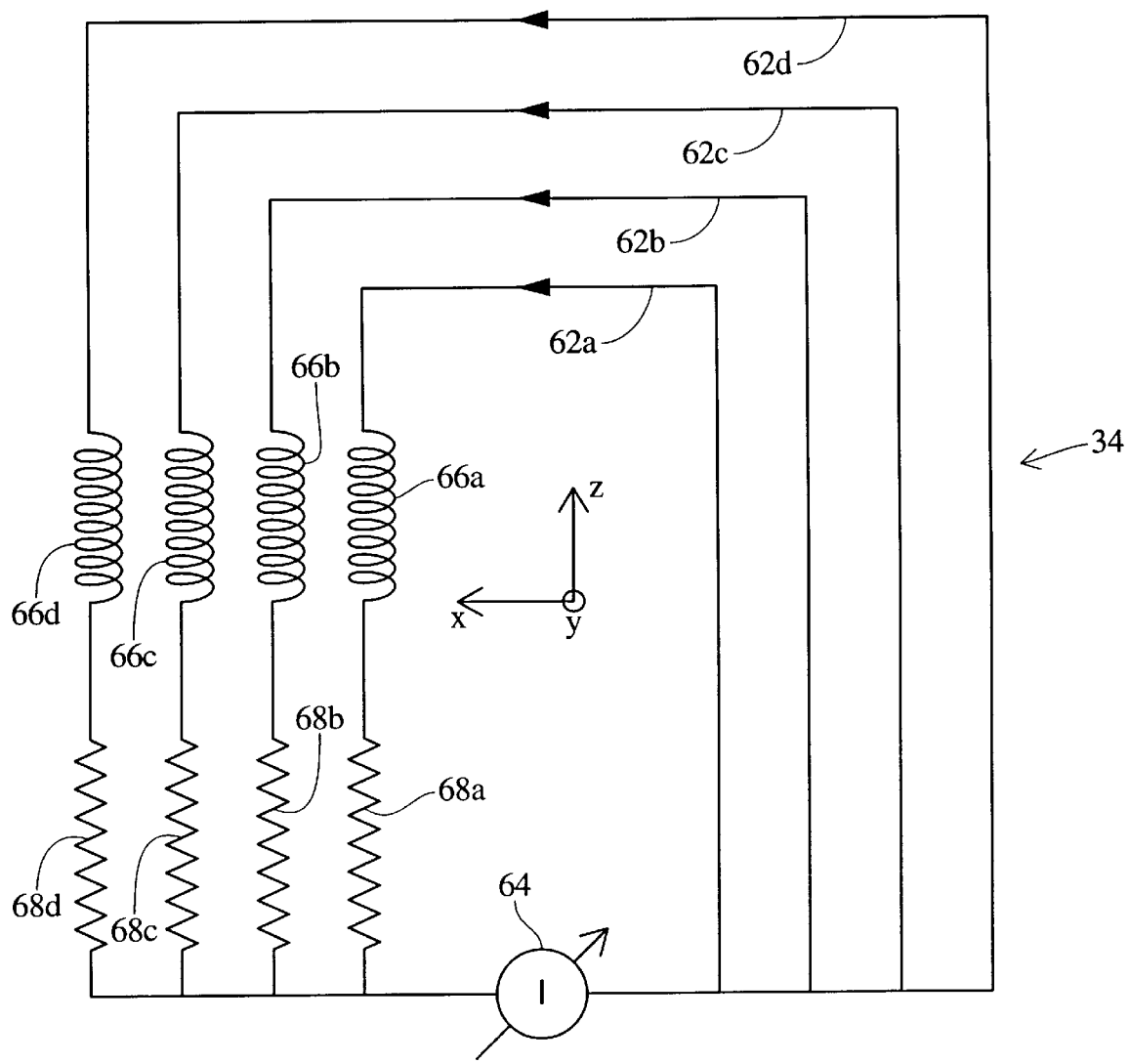
FIG. 2 is a schematic of the localized shim coil in accordance with an aspect of the present invention.

With reference to FIG. 2 and continuing reference to FIG. 1, in one preferred embodiment, the integrated localized shim coil 34 includes a plurality of conductive elements 62a–d. The conductive elements 62a–d are connected in parallel to a current source 64. Connected to each conductive element is a series connected choke and resistor pair, pairs 66a–d and 68a–d, respectively. When engaged, the current generated by the current source 64 flows through the conductive elements 62a–d thereby generating a localized magnetic field in the region of the shim coil 34. The shim coil is dimensioned and shaped such that the localized magnetic field generated by the integrated shim coil 34 is substantially equal to and opposite of inhomogeneities and non-uniformities created in the magnetic field due to the geometric shape and susceptibility of the selected region of the subject being imaged. For example, the localized magnetic field generated may substantially cancel or negate a 2 to 3 ppm or higher magnetic field non-uniformity that exists in the shoulder-to-neck transition region when that region is being imaged. Due to the proximity of the localized shim coil to the region of interest and the area of the non-uniformity in the magnetic field, it can accurately correct for very localized magnetic field perturbations. Additionally, the current is adjustable to provide more or less correction as required on a subject-to-subject or scan-by-scan basis.

The chokes 66a–d allow the localized shim coil 60 to operate without affecting the RF fields. That is to say, the chokes 66a–d present high impedance to currents having frequencies near the resonant frequency of the system. The resistors 68a–d serve to balance the amount of current flowing through each of the conductive elements 62a–d to shape and contour the shimming field. The resistors, like the current source, may be variable in nature.

In alternate embodiments, the chokes 66a–d are replaced by capacitor-inductor tank circuits. As opposed to the chokes 66a–d, the tank circuits would present high impedance to currents having frequencies near the resonant frequency of the system. In this manner, the tank circuits suppress resonant frequency currents from flowing within the conductive elements 62a–d.

Figure 3:
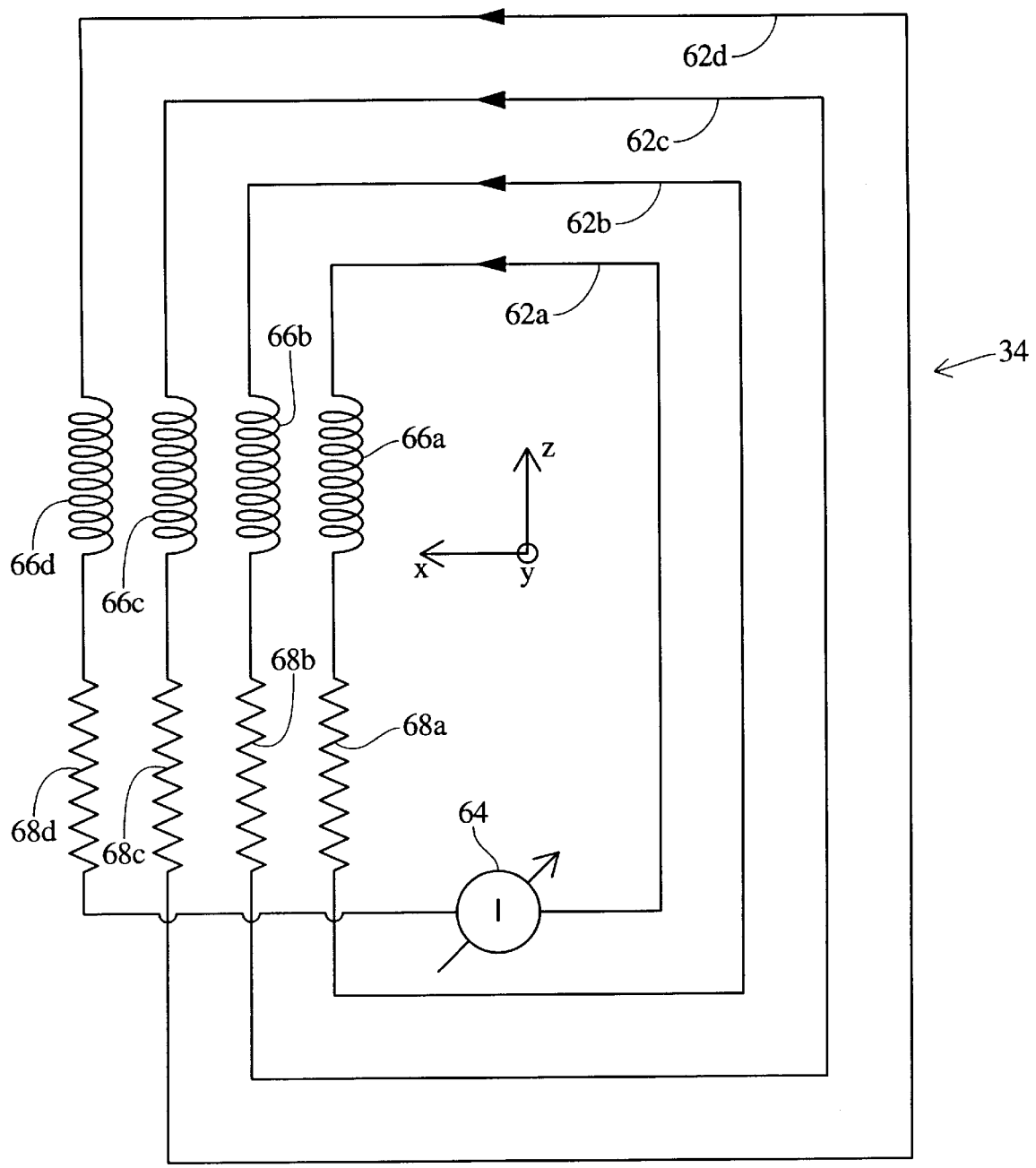
FIG. 3 is a schematic of the localized shim coil in accordance with another aspect of the present invention; and, FIG. 4 is an illustration of pulse sequences in accordance with aspects of the present invention.

With reference to FIG. 3, an alternate embodiment of the localized shim coil is illustrated wherein the conductive elements 62a–d are connected in series rather than in parallel. However, in theory and operation, this alternate embodiment of the localized shim coil 60 is the same as that previously described. In any event, either embodiment is preferably laid out on a dielectric former and integrated with a local RF surface coil 32. Alternately, the localized shim coil 60 may be left separate from the surface coil and placed directly on the subject being examined in the particular region of interest.

Figure 4:
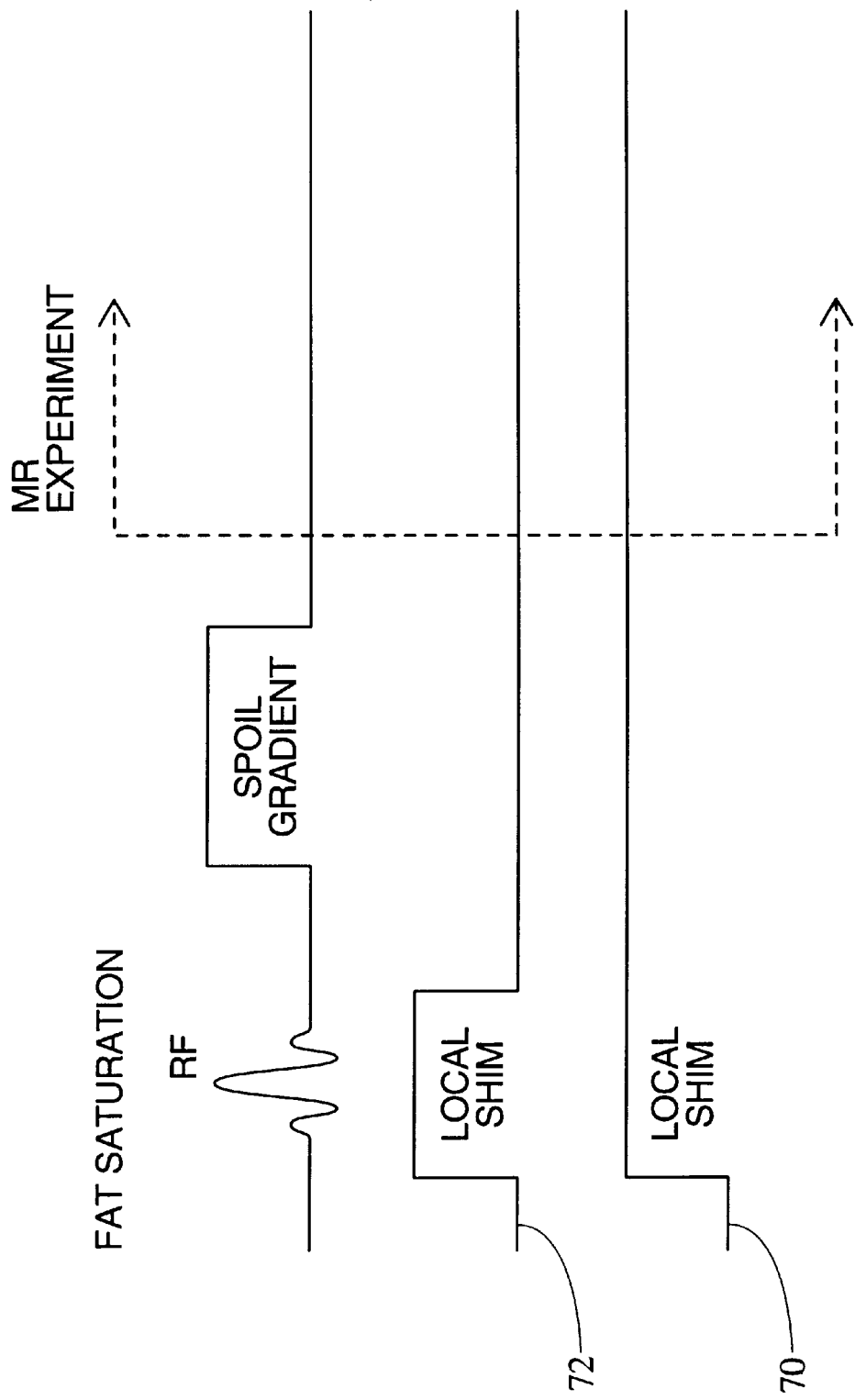

With reference to FIG. 4, the correction currents generated by the current source 64 can either be DC currents applied for the entire duration of the MRI scan as shown by pulse sequence 70 or particular current pulses applied during selected portions of the imaging sequence such as preconditioning pulses and the like. For example, the localized shim coil may be engaged only during the fat suppression RF pulse portion of the scan sequence as shown by pulse sequence 72. Further, the localized shim coil 60 may be optionally driven by its own current source 64 or it may be connected in series with an active decoupling current of the localized surface RF receive-only coil 32 with which it may be integrated.

While the localized shim coil has been presented with reference to the transition region between the neck and shoulders, it is appreciated that the localized shim coil is applicable for imaging of many regions of the anatomy such as shoulders, knees, ankles, breasts, facial, and like regions. That is to say, any localized region of interest where shape and/or magnetic susceptibility generate non-uniformities and inhomogeneity in the magnetic field are appropriate regions for employment of the localized shim coil. In a like manner, it is also appreciated that the invention presented herein is applicable not only to fat suppression techniques but also to those techniques which are highly sensitive to non-uniformities and/or inhomogeneities at the 1 to 3 ppm level. For example, in certain applications it is desirable to suppress other tissues and/or species. Additionally, spatial saturation techniques may be employed. Furthermore, while illustrated with only four conductive elements, it is to be appreciated that any number may be employed depending on the size and nature of the localized region being examined and/or the size and location of the inhomogeneity in the magnetic field.

The invention has been described with reference to the preferred embodiments. Obviously, modifications and alterations will occur to others upon reading and understanding the preceding detailed description. It is intended that the invention be construed as including all such modifications and alterations insofar as they come within the scope of the appended claims or the equivalents thereof.

Having thus described the preferred embodiment, the invention is now claimed to be:

1. A localized magnetic field shim coil for correcting localized non-uniformities in a local region of a main magnetic field in a magnetic resonance imaging system comprising:

a plurality of conductive elements connected to a current source, the plurality of conductive elements arranged adjacent a localized region of a subject being imaged such that current flowing through the conductive elements generates a localized magnetic field; and, a plurality of series connected choke and resistor pairs connected to each conductive element, the chokes suppressing currents having frequencies substantially the same as a resonance frequency of the magnetic resonance imaging system, and the resistors balancing the current flowing through each conductive element;

wherein the localized magnetic field is substantially equal and opposite to localized non-uniformities generated in the magnetic resonance imaging system's main magnetic field by the subject's geometric shape and magnetic susceptibility in the localized region being imaged.

2. The localized shim coil according to claim 1, wherein the localized shim coil is integrated into a radio frequency surface coil.

3. The localized shim coil according to claim 1, wherein the conductive elements are connected in parallel.

4. The localized shim coil according to claim 1, wherein the conductive elements are connected in series.

5. The localized shim coil according to claim 1, wherein the localized shim coil is only engaged while a fat saturation pulse sequence is transmitted by the magnetic resonance system.

6. The localized shim coil according to claim 1, wherein the localized shim coil is engaged during an entire imaging scan run by the magnetic resonance imaging system.

7. An integrated radio frequency and shim coil comprising:

a radio frequency surface coil for receiving magnetic resonance signals emanating from a region of interest of a subject being examined, the radio frequency surface coil being position contiguous to the region of interest of the subject being examined; and, a shim coil integral with the radio frequency surface coil, the shim coil including a plurality of conductive elements arranged such that electrical current flowing therein generates a localized magnetic field that substantially cancels localized inhomogeneities in a main magnetic field in the region of interest of the subject being examined, the localized inhomogeneities being induced by the subject's susceptibility and geometry in the region of interest.

* * * * *